United States Patent [19]
Bielick et al.

[11] Patent Number: 5,806,753
[45] Date of Patent: Sep. 15, 1998

[54] APPLICATION OF LOW TEMPERATURE METALLURGICAL PASTE TO FORM A BOND STRUCTURE TO ATTACH AN ELECTRONIC COMPONENT TO A CARRIER

[75] Inventors: James Daniel Bielick, Oronoco; Mark Kenneth Hoffmeyer; Phillip Duane Isaacs, both of Rochester; Thomas Donald Kidd, Stewartville, all of Minn.; David Allen Sluzewski, San Jose, Calif.

[73] Assignee: International Business Machines Corporation, Armonk, N.Y.

[21] Appl. No.: 577,586

[22] Filed: Dec. 22, 1995

[51] Int. Cl.$^6$ ........................................... H05K 3/34
[52] U.S. Cl. .................... 228/248.1; 228/180.22; 228/119; 228/191
[58] Field of Search ............. 228/180.22, 191, 228/248.1, 254, 119, 56.3

[56] References Cited

U.S. PATENT DOCUMENTS

| | | | |
|---|---|---|---|
| 3,926,360 | 12/1975 | Moister, Jr. | 228/248.1 |
| 4,216,350 | 8/1980 | Reid | 228/56.3 |
| 5,048,747 | 9/1991 | Clark et al. | 228/248.1 |
| 5,244,143 | 9/1993 | Ference et al. | |
| 5,251,806 | 10/1993 | Agarwala et al. | |
| 5,299,730 | 4/1994 | Pasch et al. | |
| 5,410,805 | 5/1995 | Pasch et al. | |
| 5,545,465 | 8/1996 | Gaynes et al. | 228/56.3 |

FOREIGN PATENT DOCUMENTS

| 36 08 101 | 9/1987 | Germany | 228/56.3 |
|---|---|---|---|

OTHER PUBLICATIONS

Research Disclosure, "Multilayer Contruction Techinque for PCB", Feb. 1992, No. 334, Kenneth Mason Publications Ltd, England.

Hwang, Jennie S., *Ball Grid Array & Fine Pitch Peripheral Interconnections*, Electrochemical Publications Ltd, pp. 21–24 (1995).

Lau, John H. (ed.) *Handbook of Fine Pitch Surface Mount Technology*, Van Nostrand Reinhold, pp. 161–232 (1994).

*Primary Examiner*—Samuel M. Heinrich
*Attorney, Agent, or Firm*—Karuna Ojanen

[57] ABSTRACT

A method of forming a bond structure for use with integrated circuits and semiconductor electronics and carrier assemblies is disclosed. Metallurgical paste is screen printed through a stencil and the stencil is left in place during the reflow process. The melting point of the bond structure and the metallurgical paste is lower than the melting point of interconnects on the electronic components and less than the decomposition temperature of the carrier assemblies to which the electronic components are bonded.

24 Claims, 7 Drawing Sheets

SOLDER CAPPED C4 BUMP

APPLICATION OF LOW TEMPERATURE METALLURGICAL PASTE TO FORM A BOND STRUCTURE TO ATTACH AN ELECTRONIC COMPONENT TO A CARRIER

This invention relates generally to a method to form bond structures to attach integrated circuits or other electronic devices to carrier assemblies. More particularly, the invention relates to a method to form a bond structure between high melting point metallurgical or solder interconnects of a semiconductor device or chip to an organic composite carrier assembly using stencil printing of low melting point metallurgical paste.

BACKGROUND OF THE INVENTION

Carrier assemblies of organic laminate composite materials are increasingly used as high density and high performance electronic multi-chip modules and single chip modules. Common methods to attach the chips to the carrier board include controlled collapse chip connect, flip chip attach, and wire bonding methods.

Controlled collapse chip connect (C4) uses interconnection pads positioned in a peripheral or area array on the face of a semiconductor chip. These interconnection pads typically are mounds or hemispherical bumps coated with high melting point lead solder. The semiconductor chip is then positioned on a carrier having a corresponding array. The solder bumps of the semiconductor chip in contact with these pads are reflowed; melting of the solder bumps induces bond formation via metallurgical reaction and wetting of the solder to the carrier pad surfaces to form solder joints. Upon cooling the solder joints solidify and electrical and mechanical interconnections are is produced.

Flip chip attach uses peripheral or area array of interconnection pads similar to those used for controlled collapse chip connect but solder bumps may or may not be present on the semiconductor chip. The chip is inverted or "flipped" so that the semiconductor device pads align with corresponding pads on the carrier to which the chip is attached. Bonding and electrical contact is established using several methods, such as the use of conductive adhesives or solder, or welding, or other methods which form either metallurgical or adhesive bonds between the semiconductor pads to the carrier pads. For flip chip attach, solder bumps, if present on the chip, are generally not reflowed.

Wire bonding is also used to establish an electrical connection between the semiconductor chip and the carrier. Wires are ultrasonically bonded from the semiconductor chip pads to pads on the carrier. The semiconductor device could be mounted with adhesive or with solder onto the carrier.

In general, use and selection of a given chip attach method is in part determined by carrier materials temperature compatibility. For example, C4 of chips with high lead (Pb) bumps is not viable as an attachment method on some flexible circuits or fiberglass reinforced circuit boards. Temperatures required for the C4 attach exceed the decomposition temperatures of many adhesives required for lamination of flexible circuit layers. Similarly, the C4 process temperatures also exceed decomposition temperatures of most epoxies used as the matrix material in fiberglass reinforced rigid printed circuit boards. For chip on board compatibility on these flexible printed circuit or printed circuit board materials wire bonding processes are generally used. In order to provide compatibility with these flexible printed circuit or printed circuit board materials, however, a low melting point alloy must be present on either carrier pad surfaces or on the semiconductor chip solder bumps.

The methods devised to apply a small uniform volume of the low melting point solder onto the carrier or onto the interconnects of the semiconductor device typically are complex and require specialized tools. U.S. Pat. No. 5,251,806 entitled "Method of Forming Dual Height Solder Interconnection" to Agarwala et al., is a method of providing a semiconductor chip with a bump structure of low melting point solder on top of a high melting point solder bump. The dry processing technique of '806 with vapor deposition and sputtering alters the geometry of the solder bump to increase the integrity of the connection. U.S. Pat. No. 5,244,143 to Ference et al. entitled, "Apparatus and Method for Injection Molding Solder and Applications Thereof" provides a process known as molten solder inject in which molten solder is dispensed under pressure through a heated nozzle attached to a pattern of apertures which is aligned to either semiconductor chip or carrier surfaces. Subsequent cleaning, bump flattening, recleaning, and independent fluxing operations are then necessary to finalize the flip chip attachment assembly.

U.S. Pat. Nos. 5,299,730 and 5,410,805 to Pasch et al. disclose the attachment of semiconductor chips possessing high melt solder bumps to cards with low melt solder deposits with specific consideration given to flux containment using a preform sandwich. Methods of providing the solder-on-solder structure are not disclosed.

Another technique to attach a semiconductor device having an array of raised high melting point solder bumps to an organic carrier involves first electroplating the organic carrier with a low melting point solder, such as tin/lead (Sn/Pb). The use of card platings, however, is expensive and has solderability restrictions such as short shelf life. The electroplating technique, moreover, is not conducive to easily reworking and/or replacing any semiconductor device on the carrier. The depth of the electroplating is relatively thin and the electroplated material forms an alloy with higher melting point characteristics when attachment reflow occurs. Depending upon the plating material used and the extent of alloy formation, removal and replacement of a semiconductor device may damage the carrier, and the interconnection pad sites may have to be redressed.

In view of the shortcomings of the methods presently used, a need exists for a simpler method to provide metallurgically active bond structures on the electrical interconnects of an electronic component, such as a semiconductor device and its carrier, for a method that is thermally compatible with the carrier materials, especially in the field of high density single chip module/multi chip module manufacturing.

One object of the invention is to provide a cost effective method to coat area array interconnects on semiconductor devices with low melting point solder using commonly available tools in the semiconductor chip assembly industry. The object is realized by transferring the solder or other metallurgical paste with in situ stencil placement, printing, and reflow of solder paste onto area array interconnects.

It is yet another object of the invention to attach semiconductor devices to carriers comprised of materials that are incompatible with standard C4 reflow processes and associated reflow temperatures. By applying low melting point solder or other metallurgical paste onto the area array interconnects on the carrier, thermal compatibility is achieved which yields the additional advantage of greater flexibility with surface treatment of the interconnects.

It is still another object of the invention to provide a bond structure that facilitates removal of semiconductor devices and recycling of the remaining semiconductor/carrier assemblies. The object is achieved by the presence of a layer of low melting point solder on the semiconductor device interconnects because reheating and remelting this layer permits easy removal of defective or obsolete semiconductor devices from carrier surfaces at temperatures that don't damage the carrier.

Yet another object of the invention is to provide bond structures that facilitate simple replacement of semiconductor devices and carrier rework compatible with materials comprising the carrier to which replacement devices are to be attached. Once a semiconductor device is removed as described above, reattachment of replacement semiconductor devices is easy if the replacement devices have the bond structure of the invention. Again, the layer of low melting point solder on the semiconductor device interconnects permits the use of reattachment processes that are compatible with the carrier materials.

It is still another object of one embodiment of the invention to provide the bond structure on the semiconductor device rather than the carrier. An additional advantage is that the placement of the semiconductor device onto the carrier is more stable and, prior to reflow attachment, misalignment is avoided. Also, as opposed to processes where low melting point solder is directly applied to the carrier, the process step of flattening the carrier solder is eliminated.

It is yet another object of the invention to provide a process which can be used with both semiconductor devices or chips and wafers. The process herein permits device customization and high volume wafer fabrication of devices because the process to make the bond structure is compatible with low temperature flip chip attachment and rework requirements.

It is yet another object of the invention to use screen printing to coat low melting point solder or metallurgical paste onto electrical and/or mechanical interconnects having different geometries. The conductive materials forming part of the interconnects have a melting point higher than the solder or metallurgical paste. When a layer of low melting point solder is melted onto raised interconnects, a standoff between the semiconductor device and the carrier is created. This standoff decreases susceptibility of the interconnect to thermal fatigue which, of course, extends the life of solder joint.

It is yet another object to use a stencil or screen printing process in which the stencil and substrate materials are compatible with the electronic devices, the metallurgical paste, and the carriers during the elevated temperature exposure required for low melting point metallurgical paste reflow.

SUMMARY OF THE INVENTION

These and other objects of the invention have been realized by a method to form a bond structure to attach an electronic component to a carrier using the application of low temperature metallurgical paste which comprise the steps of applying a metallurgical paste through a stencil onto a substrate, in which the stencil has apertures in a pattern similar to the interconnects of the electronic component; then the electronic component is aligned onto the stencil and the substrate so that the interconnects align with the apertures to form a sandwich arrangement of substrate-stencil-electronic component; the sandwich arrangement is then heated to reflow the metallurgical paste onto the interconnects; and the layered arrangement is cooled to form the bond structure. The reflow temperature of the metallurgical paste which may be a low melting point solder, is lower than the melting point range of the interconnects and/or lower than the decomposition temperature range of the carrier. The arrangement, after sufficient cooling, is then disassembled and cleaned to remove the metallurgical paste not on the bond structure. The stencil and/or the substrate may be inert to the metallurgical paste, and the stencil and/or substrate may have a coefficient of thermal expansion similar to the electronic component. These techniques can also be applied to a method to replace an integrated circuit with interconnects bonded to a carrier assembly with bond structures, wherein the method comprises the steps of heating the carrier assembly with the integrated circuit to a temperature to reflow metallurgical paste of the bond structure formed by the above method; and then while still within the melting point range of the metallurgical paste, removing the integrated circuit from the carrier; cleaning the carrier assembly of any residue of metallurgical paste; then cooling the carrier assembly; then applying a replacement integrated circuit to the carrier wherein the replacement integrated circuit has a bond structure formed by the above method; and reflowing the metallurgical paste of the bond structure of the replacement integrated circuit to establish a new bond on the carrier assembly.

The invention will be further understood by the description and the drawings of the invention which follow.

DESCRIPTION OF THE INVENTION

Figure 1A:
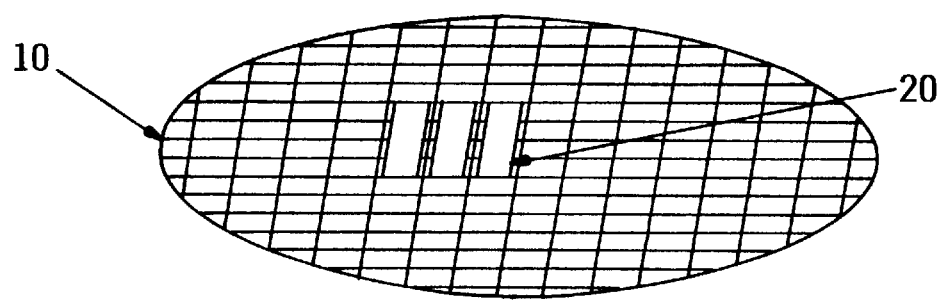
FIGS. 1a, 1b, 1c illustrate the application of the metallurgical paste to a wafer through a stencil in accordance with one embodiment the invention.
Figure 1B:
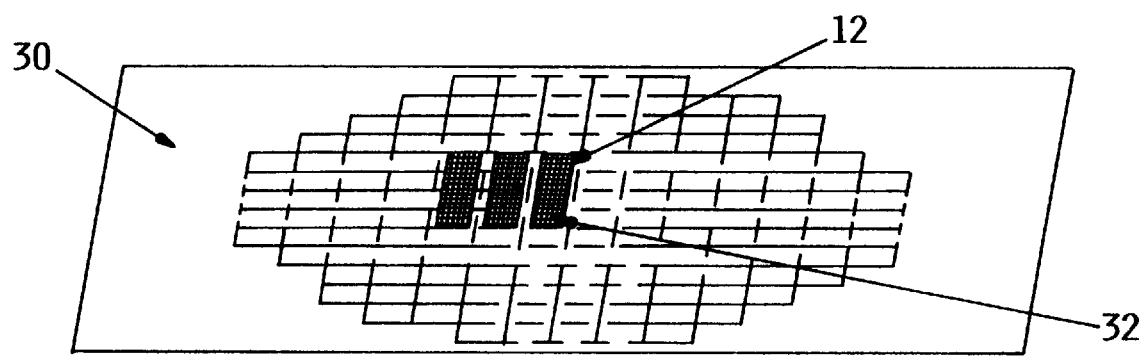
Figure 1C:
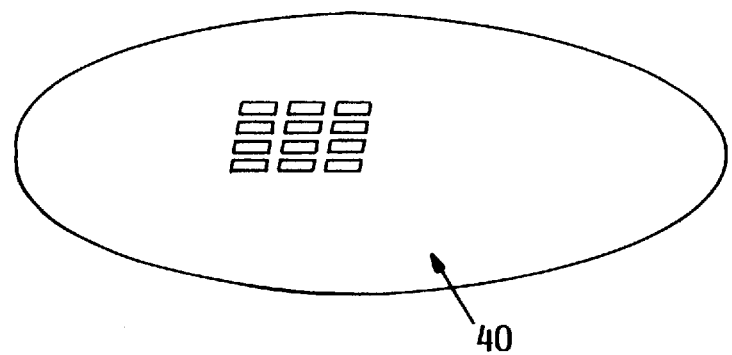
Figure 2A:
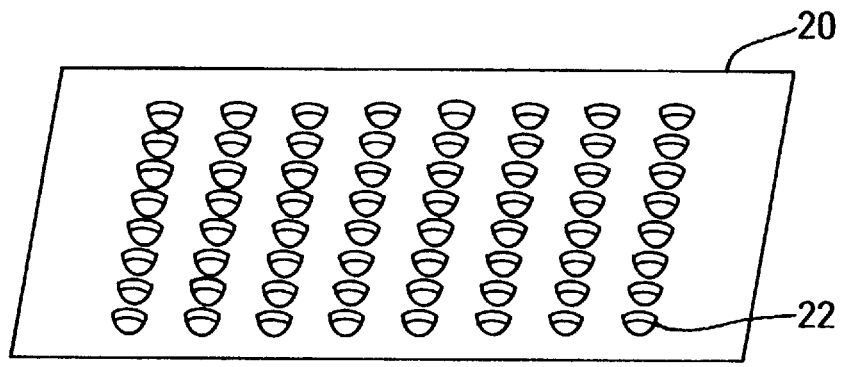
FIGS. 2a, 2b, and 2c are enlarged details of FIG. 1.
Figure 2B:
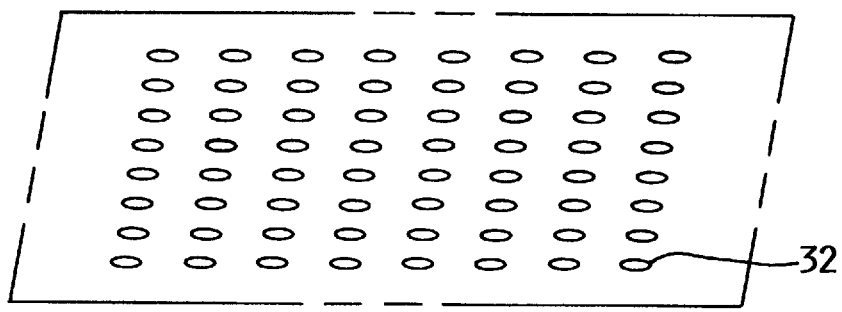
Figure 2C:
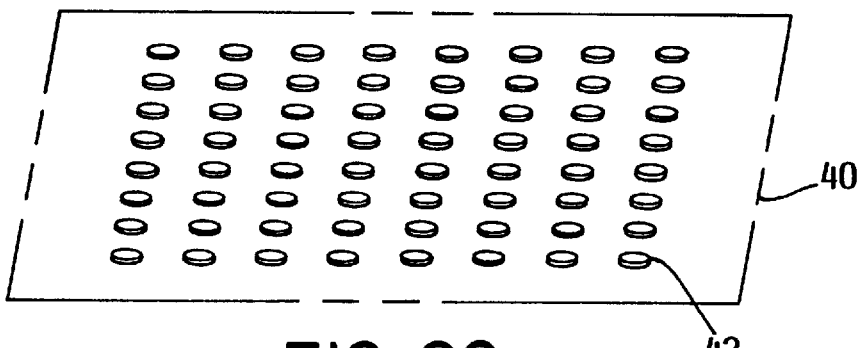

FIGS. 1a, 1b, and 1c illustrate the inventive method herein of transferring metallurgical paste 12 such as solder through a stencil 30 or other foraminous screen to form an electrical and/or mechanical bond structure on a wafer 10, a semiconductor device 20, an integrated circuit, or other electronic component so that the device or component attaches to a carrier assembly or board. The resulting bond structure, also called a cap, a layer, or coating, is a mechanical and an electrically conductive feature between the interconnects 18 shown in FIG. 3 of electronic component 10/20 and the carrier. The term electronic component 10/20 herein refers to a wafer 10, a semiconductor device 20, an integrated circuit or other electronic components. FIG. 1a shows a semiconductor wafer 10 having a number of integrated circuits subdivided into semiconductor devices or chips 20. The electronic component 10/20 to be used in accordance with the method described herein has interconnect surfaces, referred to as interconnects 18 as shown in FIGS. 3, 4a, 4b, and 4c, that are the electrical connections between the electronic component 10/20 and the carrier. Interconnects 18 on electronic components 10/20 in general, but especially on semiconductor chips 20, may be raised hemispherical bumps/mounds made of or covered with gold, high melting point solder or other electrically conductive material which is also metallurgically reactive with the metallurgical paste 12 to be used in accordance with the invention. Depending upon the geometry of the interconnects 18, including planar or contoured in or out of the surface of the electronic component 10/20, the alternative embodiment of the method herein may be more appropriate. Typical size of the interconnects 18 are 0.004–0.005 inch, spaced on center-to-center pitches of 0.009–012 inch. It is to be understood, of course, that as interconnects 18 become more densely packed because technology advances, the inventive process described herein is equally applicable.

Figure 3:
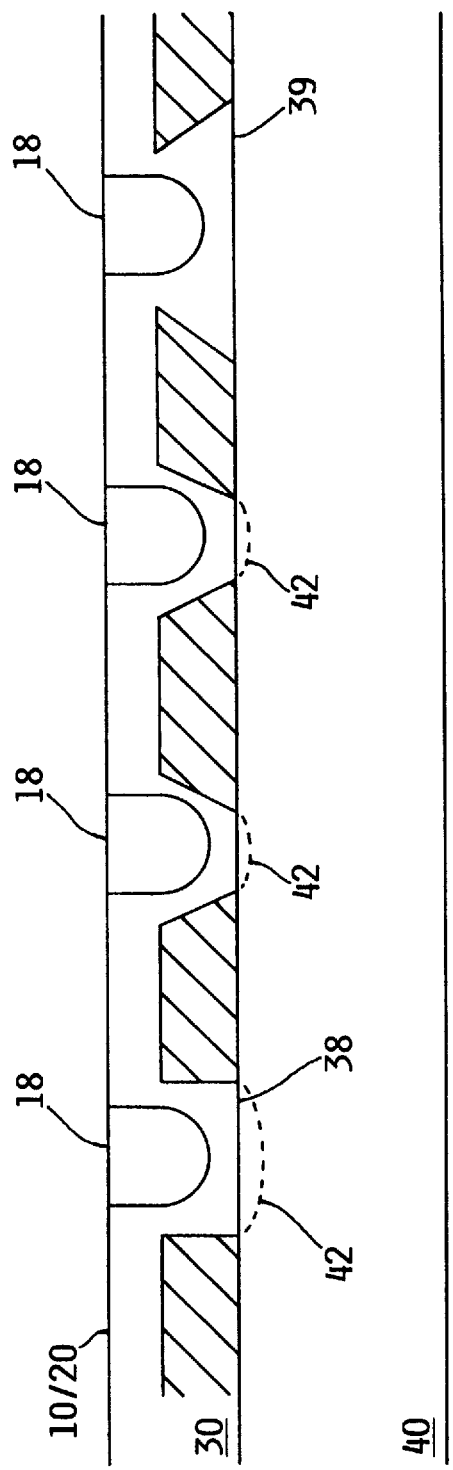
FIG. 3 is an enlarged view of an embodiment of the application of the metallurgical paste to an electronic component through a stencil in accordance with one embodiment of the invention.

Referring to FIGS. 1c and 3, substrate 40 is any flat level polished surface that is inert to the metallurgical paste 12, its constituents, the carrier, the stencil 30, and the electronic components 10/20 under the thermal and chemical environment of the process. It is preferable that substrate 40 has a coefficient of thermal expansion similar to stencil 30 and the electronic component 10/20 to which the metallurgical paste 12 is being transferred. A silicon substrate 40 is suitable, but any material having these qualities is adequate so long as reactivity of the metallurgical paste 12 is restricted only to interconnects 18. Alternative non-reactive materials having low coefficients of thermal expansion for use as substrate 40 include molybdenum, titanium, such nickel-based alloys as Kovar(R) or Invar(R), ceramic, or glass. A pattern of dimples, shown as 42 on FIG. 3, mimicking the pattern of interconnects 18 on the electronic components 10/20 can be produced in the surface of the substrate 40 with machining, laser cutting, or chemical etching. The dimples 42 enhance the transfer of the metallurgical paste 12 to the substrate 40 and the electronic components 10/20.

The metallurgical paste 12 may be a solder, a solder paste, or a conductive adhesive under certain circumstances. The metallurgical components of the paste 12 have a melting point range lower than the material on the array of interconnects 18 to which the metallurgical paste 12 is transferred. The melting point range of the metallurgical paste 12 is also less than the temperature at which the carrier board to which the electronic component 10/20 will be attached might begin to degrade. In FIG. 1b, a low melting point metallurgical paste 12, such as those described in Hwang, Jennie S., *Ball Grid Array & Fine Pitch Peripheral Interconnections*, ELECTROCHEMICAL PUBLICATIONS LTD. pp. 21–24 (1995), is printed through a stencil 30 and onto substrate 40, shown in FIG. 1c. The viscosity of the metallurgical paste 12 determines how effectively the paste fills the apertures in stencil 30 and is a function of the percentage content of metals within the paste and the relative viscosity of the remaining components.

The foraminous stencil 30 also is inert to the metallurgical paste 12, its constituents, the substrate 40, the carrier, and the electronic components 10/20 under the thermal and chemical environment of the process. It is also preferable that stencil 30 has a coefficient of thermal expansion similar to the electronic component 10/20 to which the metallurgical paste 12 is being transferred in order to avoid misalignment of transferred paste on the interconnects 18. If the stencil 30 has a different coefficient of thermal expansion than the substrate 40 or the electronic component 10/20, misalignment between the interconnects 18 into apertures 32 occur during the elevated temperatures of reflow processing. A stencil 30 of molybdenum, titanium, or an iron/nickel based alloy stencil has thermal expansion characteristics compatible with the process and substrate 40 and electronic component 10/20, but any material also having these qualities is also suitable so long as reactivity of the metallurgical paste 12 is restricted only to the interconnects 18. Substrate 40 and stencil 30 can be unitary because of the similar required properties.

The stencil 30 has a plurality of apertures 32 which match the plurality of interconnects 18 on the electronic component 10/20. The thickness of stencil 30 and/or the apertures 32 and the geometry of the interconnects 18, inter alia, determine the quality and the geometry of the bond structure 50, shown in FIG. 5, and can be tailored to achieve desired effects. Apertures 32 can be created with mechanical punches, laser ablation, chemical etching, or combination thereof. A typical thickness of the stencil 30 is on the order of 0.002–0.010 inch. The aperture 32 size and geometry determines the volume of metallurgical paste 12 applied to the interconnects 18 which greatly influences the ability to rework. The greater volume of metallurgical paste 12 on the resulting bond structure, the less alloying will occur between the carrier, the paste 12, and the interconnects 18. In this way, a higher volume of metallurgical paste 12 maintains the low melting features of the invention because alloying raises the melting point of the resulting bond structure.

Figure 4A:
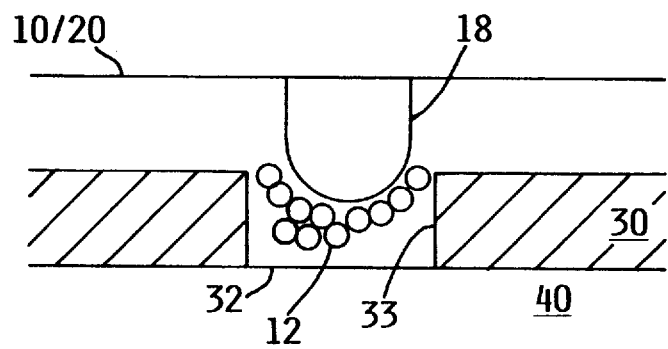
FIGS. 4a, 4b, 4c illustrate various geometries of the stencil apertures.
Figure 4B:
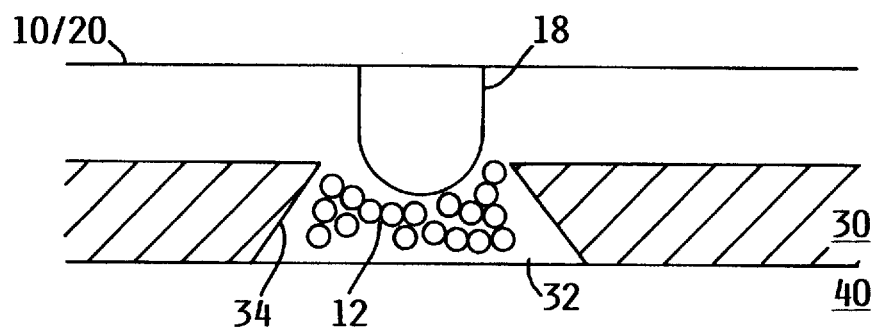
Figure 4C:
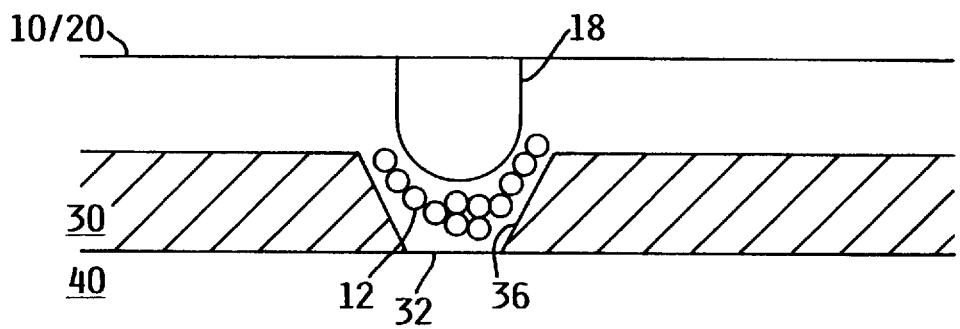

Apertures 32 can be of any shape, dimension, depth; several provided are shown in FIGS. 4a, 4b, and 4c. The steep side wall of the inner surface 33 of the apertures 32, shown in FIG. 4a, provides higher volume of and maximum coverage of the interconnects 18 with metallurgical paste 12. Apertures 32 whose walls 34 make an acute angle with respect to the surface of the substrate 40, shown in FIG. 4b, minimize the effective volume of metallurgical paste 12 and restrict the amount of reflow onto the surface of the electronic component 10/20. Apertures 32 whose tapered side walls 36 shown in FIG. 4c form an obtuse angle with respect to the surface of the substrate 40 permit efficient aperture filling, good paste coverage onto the interconnects 18 and minimize potentially detrimental surface tension effects which could cause sticking of reflowed paste 12 onto the stencil walls 36 and substrate 40.

The metallurgical paste 12 is printed into apertures 32 in stencil 30 on the substrate 40 as shown in FIG. 3. See Lau, John H. (ed.), *Handbook of Fine Pitch Surface Mount Technology*, Van Nostrand Reinhold, pp. 161–232 (1994) for techniques of screen printing techniques using metallurgical pastes. The apertures 32 are in a pattern substantially identical to the pattern of interconnects 18 on the electronic components 10/20. In this process, squeegeeing the metallurgical paste 12 into and through oversized apertures 32 in the stencil 30 consistently fill the apertures 32 with the paste 12. The metallurgical paste 12 should fill the apertures 32 to a depth to ensure contact of the paste 12 with the interconnects 18 for efficient metallurgical reaction, i.e., removal of oxides on the surface of the interconnect 18.

After the metallurgical paste 12 is stencilled onto the substrate 40 and the apertures 32 are filled to the desired depth with the metallurgical paste 12, the interconnects 18 of the electronic component 10/20 are aligned into the apertures 32 using a placement tool such as a split prism optics placement tool. The seating depth of the interconnects 18 within the aperture 32 can tailor certain geometries and effects of the resulting bond structure. Oversize apertures 32 such as 38 and 39 shown in FIG. 3 allow complete seating of the interconnect 18 in the aperture 32 which facilitates alignment of the interconnects 12 and minimizes damage to the electronic components 10/20. When stencil 30 rides directly on the electronic component 10/20 as shown in FIGS. 6 and 7, alignment is difficult and application of the metallurgical paste 12 requires care to avoid damaging the interconnects 18.

Figure 5:
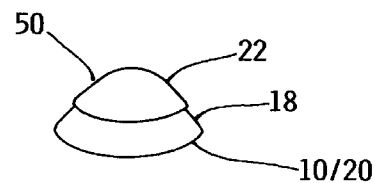
FIG. 5 illustrates the structure of a bump capped with the low melting point solder.

The substrate/stencil/electronic component layered arrangement is then exposed to a reflow process which melts the metallurgical paste 12. During reflow the apertures 32, and especially the acute apertures 36 shown in FIG. 4c, contain the metallurgical paste 12 which dramatically reduces bridging or the presence of unwanted paste on the electronic components 10/20. When using a metallurgical paste of 63/37 percent weight tin/lead (Sn/Pb) low melting point solder, an exposure to a maximum reflow temperature ranging from 200–225 degrees Celsius for a time of approximately thirty seconds to one minute is usually sufficient. Of course, temperatures and times of the reflow process will vary with the paste composition, the mass of the components, the thermal conductivity of the chip/wafer/substrate/stencil configuration, etc. Stencil 30 is left in position over substrate 40 during the reflow unlike conventional printing practices with metallurgical paste 12. Removing the stencil 30 prior to reflow causes non-uniform paste 12 deposition and inconsistent release of the paste 12 from the aperture walls 32 of the stencil 30 which undermines the ability to provide good solder volume consistency on small interconnects 18 such as raised bumps or ultra fine pitch pads. After reflow of the paste 12 and its transfer to the interconnects 18 is complete, the arrangement is cooled to solidify the metallurgical paste 12 onto the interconnects 18 to form the bond structure 50 shown in FIG. 5. It is preferable to cool the arrangement in an ambient temperature until it reaches ambient temperature. The electronic component 10/20, however, can be removed at warmer temperatures to affect the geometry of the bond structure 50, if desired. After the electronic component, wafer/chip 10/20, is removed from the stencil 30 and substrate 40, it is cleaned to remove any reflux residue. After cleaning, the wafer 10 or chip 20 is ready for either further processing such as dicing in the case of a wafer 10 or for assembly to a carrier for or individual chips. A finished bond structure 50 on an electronic component 10/20 is shown in FIG. 5. The method described herein has been used to process capped lead-rich bump interconnects with 63/37 weight percent Sn/Pb solder on 5.7 square millimeter semiconductor chips 20 possessing an array of 120 bump interconnects of 0.005 inch diameter with a center to center pitch of 0.012 inch. Consistent capping of interconnects 18 with the metallurgical paste 12 is thus achieved over the entire wafer and/or chip dimensions.

Figure 6:
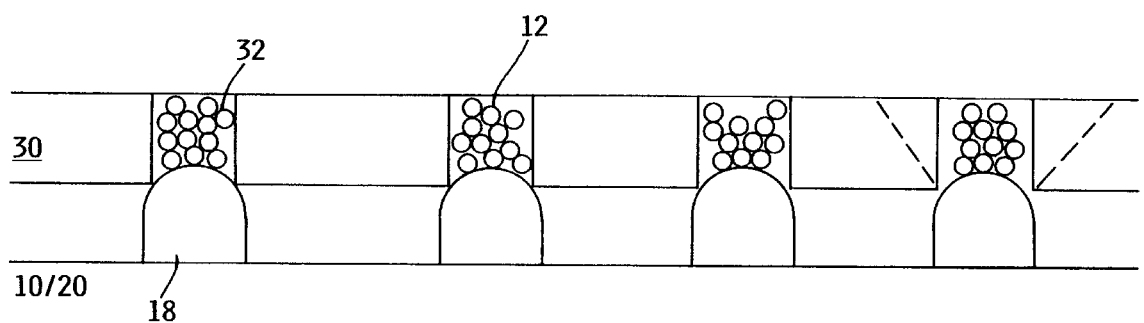
FIG. 6 illustrates the application of metallurgical paste directly onto an electronic component in accordance with an alternative method of the invention.
Figure 7:
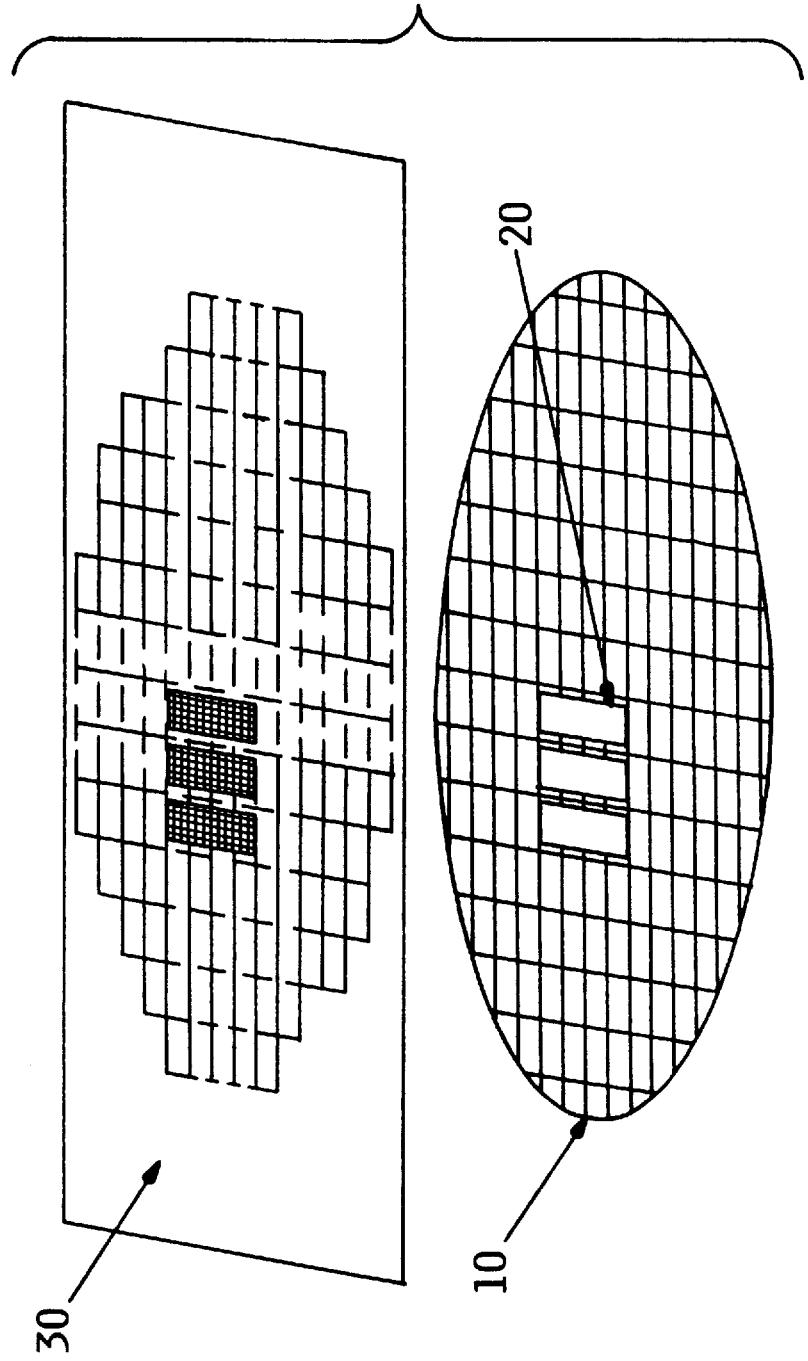
FIG. 7 illustrates the application of metallurgical paste directly onto a wafer in accordance with an alternative embodiment of the invention.
Figure 8:
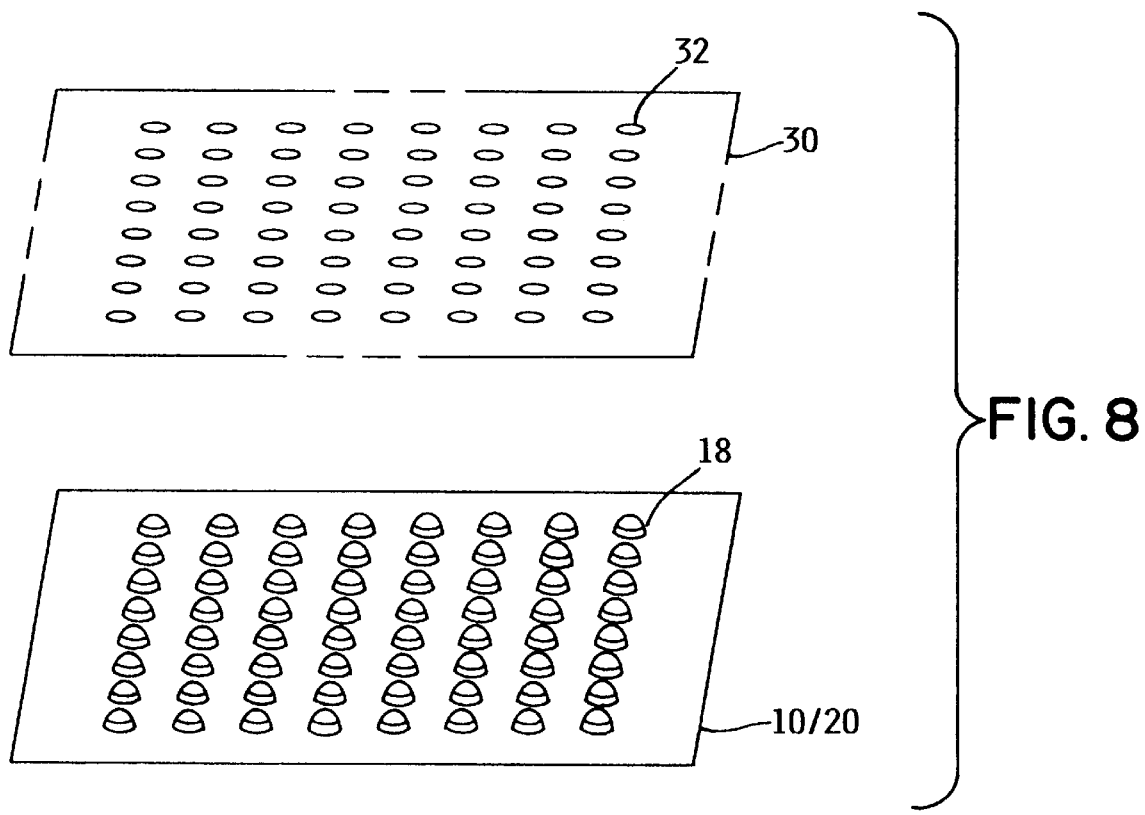
FIG. 8 is an enlarged detail of FIG. 7.

An alternative embodiment of the inventive method, illustrated in FIGS. 6, 7, and 8, provides direct stencil application of the metallurgical paste 12 onto the interconnects 18 present on the electronic component 10/20. Given a wafer 10 and/or an individual chip 20 which is rigidly secured, the stencil 30 with apertures 32 is placed onto the wafer 10 or chip 20. The metallurgical paste 12 is squeegeed directly onto the interconnects 18 through the stencil 30. The wafer 10 or chip 20, stencil 30 with the metallurgical paste is placed in an oven for reflow and then cooled. The stencil 30 is removed and the wafer 10 or chip 20 is cleaned with, e.g., deionized distilled water, alcohol, or other suitable solvents for removal of flux residue. Similarly, the stencil 30 can be cleaned for future use.

Thus, what has been invented is a method of forming a bond structure to mount an electronic component onto a carrier board by stencil printing metallurgical paste onto either a substrate or directly onto the interconnects of an electronic component, usually a semiconductor chip, a wafer, or an integrated circuit itself. The metallurgical paste has a lower melting point than the temperature at which the carrier is susceptible to thermal damage and lower than the materials of the interconnects on the electronic component. The stencil remains in place while the metallurgical paste is reflowed to form the bond structure and then the stencil is removed. This inventive method herein of forming bond structures is simplified and is easy to implement in semiconductor assembly facilities. The invention having been described, the claims will now be set forth.

What is claimed is:

1. A method to provide a bond structure on an electronic component, comprising the steps of:

a. applying a metallurgical paste through a stencil onto a substrate, said stencil having a plurality of apertures in a pattern similar to a plurality of interconnects on said electronic component;

b. aligning said electronic component onto said stencil and said substrate so that said interconnects substantially align with said apertures to form a sandwich arrangement of substrate-stencil-electronic component;

c. heating said arrangement to reflow said metallurgical paste onto said interconnects; and d. cooling said layered arrangement to form said bond structure.

2. The method of claim 1 where in said step of heating is at a temperature lower than the melting point range of said interconnects.

3. The method of claim 1 wherein said step of heating is at a temperature lower than the decomposition temperature range of said carrier.

4. The method of claim 1, further comprising the steps of:

e. removing said semiconductor device from said arrangement; and f. cleaning said semiconductor device to remove residue of said metallurgical paste not on said bond structure.

5. The method of claim 1, wherein said metallurgical paste is a low melting point solder.

6. The method of claim 5, wherein said low melting point solder is a tin/lead solder.

7. The method of claim 6, wherein said step of heating is at 200–225 degrees Celsius for thirty seconds to one minute.

8. The method of claim 1, wherein said step of aligning is accomplished using a split prism optics placement tool.

9. The method of claim 1, wherein said stencil is inert to said metallurgical paste.

10. The method of claim 1, wherein said substrate is inert to said metallurgical paste.

11. The method of claim 9, wherein said stencil has a coefficient of thermal expansion similar to said electronic component.

12. The method of claim 11, wherein said stencil is made from a material from the group consisting of molybdenum, titanium, and an iron/nickel based alloy.

13. The method of claim 10, wherein said substrate has a coefficient of thermal expansion similar to said electronic component.

14. The method of claim 13, wherein said substrate is made from a material from the group consisting of molybdenum, titanium, an iron/nickel based alloy, glass, ceramic, and silicon.

15. The method of claim 9, wherein said stencil and said substrate are unitary.

16. The method of claim 1, wherein said step of aligning said electronic component onto said substrate substantially immerses only said interconnects into said metallurgical paste.

17. The method of claim 1, wherein said apertures are of a dimension slightly larger than the dimensions of said interconnects.

18. The method of claim 1, wherein said step of cooling is at an ambient temperature.

19. The method of claim 1, wherein said step of cleaning is done with deionized, distilled water or alcohol solution.

20. The method of claim 1, wherein said electronic component is a semiconductor chip.

21. The method of claim 1, wherein said electronic component is an integrated circuit.

22. The method of claim 1, wherein said electronic component is a semiconductor wafer.

23. A method to replace a first integrated circuit having a plurality of interconnects bonded to a carrier assembly with bond structures formed by the method of claim 1, said method comprising the steps of:

(a) heating said carrier assembly having said first integrated circuit to a temperature to reflow metallurgical paste of said bond structure;

(b) while still within the melting point range of said metallurgical paste, removing said integrated circuit from said carrier;

(c) cleaning said carrier assembly of any residue of metallurgical paste;

(d) cooling said carrier assembly;

(e) applying a second integrated circuit to said carrier, said second integrated circuit having a bond structure formed by method of claim 1; and (f) reflowing said metallurgical paste of said bond structure of said second integrated circuit to establish a bond on said carrier assembly.

24. A method to provide a bond structure on an electronic component to bond said semiconductor device to a carrier, comprising the steps of:

a. applying a 63/37 percent weight tin/lead, low melting point solder through a stencil onto a substrate, said stencil having apertures in a substantially identical pattern of an area array of interconnects having a melting point higher than said solder on said semiconductor device;

b. aligning said semiconductor device onto said stencil and said substrate so that said interconnects align substantially with said apertures to form a layered arrangement;

c. heating said layered arrangement to a temperature lower than the melting point of said interconnects low melting point solder and lower than the decomposition temperature of said carrier to reflow onto said interconnects; and d. cooling said layered arrangement at or near ambient temperatures to form a bond structure;

e. removing said semiconductor device from said layered arrangement when said arrangement is near or at said ambient temperature;

f. cleaning said semiconductor device with water or alcohol to remove residue of said metallurgical paste.

* * * * *